United States Patent [19]

Danstrom

[11] Patent Number: 5,587,674
[45] Date of Patent: Dec. 24, 1996

[54] COMPARATOR WITH BUILT-IN HYSTERESIS

[75] Inventor: Eric J. Danstrom, Farmington Hills, Mich.

[73] Assignee: SGS-Thomson Microelectronics, Inc., Carrollton, Tex.

[21] Appl. No.: 418,558

[22] Filed: Apr. 7, 1995

Related U.S. Application Data

[63] Continuation-in-part of Ser. No. 366,492, Dec. 30, 1994, abandoned.

[51] Int. Cl.[6] .................................................. H03K 5/22
[52] U.S. Cl. ........................ 327/67; 327/362; 327/65; 327/206; 330/260; 330/261
[58] Field of Search .................................. 327/362, 363, 327/63, 65, 67, 77, 78, 80, 81, 82, 205, 530, 538, 539, 540, 541, 542, 543, 544, 563; 330/252, 253, 259–261

[56] References Cited

U.S. PATENT DOCUMENTS

| | | | |
|---|---|---|---|
| 3,764,826 | 10/1973 | Okada | 327/71 |
| 4,324,990 | 4/1982 | Gay | 327/75 |
| 4,406,955 | 9/1983 | Lo Cascio | 327/66 |
| 4,456,840 | 6/1984 | Ide et al. | 327/89 |
| 4,535,294 | 8/1985 | Ericksen et al. | 328/150 |
| 4,634,905 | 1/1987 | Campbell, Jr. | 307/594 |
| 4,694,198 | 9/1987 | Umeki | 327/205 |
| 4,806,791 | 2/1989 | Mizuide | 307/355 |
| 4,935,719 | 6/1990 | McClure | 340/146.2 |
| 4,972,517 | 11/1990 | Kondou et al. | 327/65 |
| 5,070,295 | 12/1991 | Morigami | 323/314 |
| 5,140,187 | 8/1992 | Schwob | 307/355 |
| 5,177,376 | 1/1993 | Wellnitz et al. | 307/290 |
| 5,182,471 | 1/1993 | Yoshida | 327/63 |
| 5,223,743 | 6/1993 | Nakagawara | 327/530 |
| 5,264,740 | 11/1993 | Wright | 307/355 |
| 5,274,275 | 12/1993 | Colles | 307/362 |
| 5,289,054 | 2/1994 | Lucas | 307/355 |
| 5,319,347 | 6/1994 | McClure | 340/146.2 |
| 5,334,883 | 8/1994 | Rosenthal | 307/290 |
| 5,357,235 | 10/1994 | McClure | 340/146.2 |
| 5,369,319 | 11/1994 | Good et al. | 327/73 |
| 5,400,007 | 3/1995 | McClure | 340/146.2 |
| 5,446,396 | 8/1995 | Brehmer | 327/66 |

*Primary Examiner*—Timothy P. Callahan
*Assistant Examiner*—Kenneth B. Wells
*Attorney, Agent, or Firm*—Joseph C. Arrambide; Theodore E. Galanthay; Renee M. Larson

[57] ABSTRACT

A comparator with a built-in hysteresis is disclosed. The comparator has a differential input stage, an output stage, and a bias circuit with a hysteresis circuit. The hysteresis circuit selectively applies a bias voltage to the differential input stage to achieve the hysteresis.

6 Claims, 3 Drawing Sheets

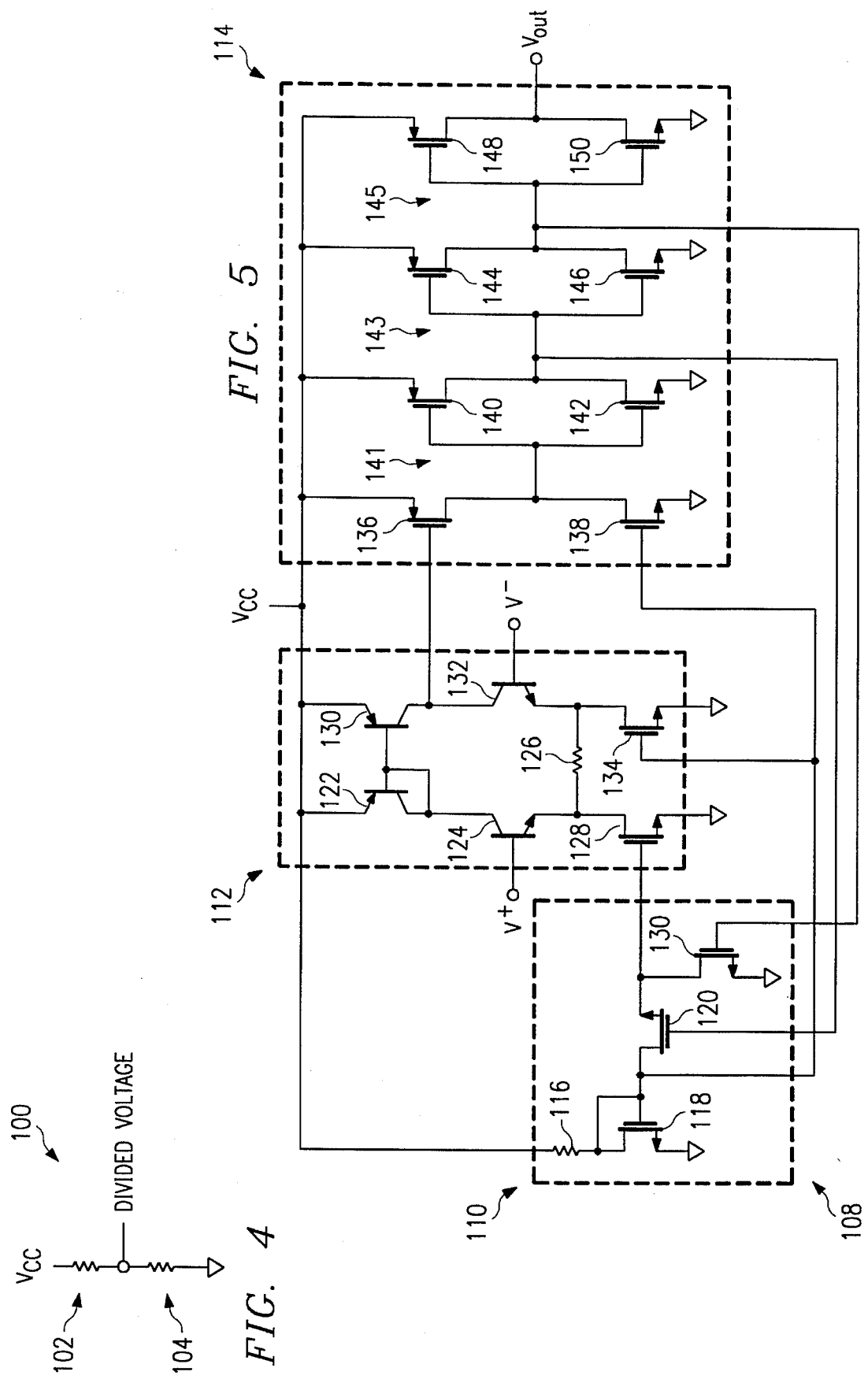

COMPARATOR WITH BUILT-IN HYSTERESIS

CROSS REFERENCE TO A RELATED APPLICATION

This application is a continuation in part of U.S. Ser. No. 08/366,492 filed Dec. 30, 1994, now abandoned, and entitled AN IMPROVED COMPARATOR WITH BUILT-IN OFFSET, which is an application.

BACKGROUND OF THE INVENTION

1. Field of the Invention

This invention relates to electronic circuits used as comparators, and more specifically to electronic circuits used as comparators with built-in hysteresis, and more specifically to comparators used in a reset circuit.

2. Description of the Relevant Art

The problem addressed by this invention is encountered in electronic circuits used to compare a first voltage to a second voltage. Commercially available comparators, such as an LM2904 are readily available and are often used to compare voltages. The LM2904 is designed for low hysteresis and low offset. However, it may be desirable in some applications to have hysteresis, such as in a reset circuit. FIG. 1 shows a prior art comparator, such as the LM2904, configured to have hysteresis as is known in the prior art. More specifically, FIG. 1 shows comparator 10 having a non-inverting input 4, an inverting input 12, and an output 8. Resistor 6 and resistor 3 add hysteresis to the circuit, as is known in the art. Typical resistor values for this configuration are 10 kilo-ohm for resistor 3 and 1 mega-ohm for resistor 6. In fact, a problem with this circuit is that large resistor values are required and/or the circuit has an undesirable low gain.

FIG. 2 shows a prior art comparator circuit 16. This circuit includes a bias circuit 18, a differential input stage 20, and a hysteresis circuit 22. The bias circuit includes current source 24 connected in series with NPN bipolar transistor 26 and resistor 28. In operation, current is generated by current source 24 to forward bias transistor 26. This creates a bias voltage which is used by the transistors in the differential input stage 20 and by transistor 48 of the comparator 16.

The differential stage includes PNP transistors 30, 36, 40 and 44, NPN transistors 32 and 46, resistors 38 and 42, and current source 34. In operation, the base of transistor 36 is the non-inverting input of comparator 16 and the base of transistor 40 is the inverting input. When the base of transistor 36 is at a higher voltage than the base of transistor 40, transistor 40 turns on and conducts the current supplied by current source 34 while transistor 36 is off. Consequently, the transistor 46 is turned off which allows transistor 44 to drive the voltage on $V_{out}$ high. Conversely, if the base of transistor 36 is lower than the base of transistor 40, then transistor 36 is on and transistor 40 is off. This condition drives the emitter of transistor 46 low which turns transistor 46 on. Since transistor 46 is on, $V_{out}$ is driven to a low voltage.

The hysteresis circuit 22 includes PNP transistor 48 and resistor 50. In operation, transistor 48 turns on when the $V^-$ input of the comparator is at a sufficiently low value to turn on transistors 40 and 48. With transistor 48 on, a voltage drop is developed across resistor 50. Therefore, the additional voltage drop is the hysteresis which must be overcome to switch the comparator when the voltage on the $V^-$ input rises.

The problem with the prior art circuit in FIG. 2 is that the circuit requires resistors 38 and 42 to be relatively low resistance so that the circuit can have sufficient dynamic range without the transistors in the differential stage operating in saturation. Consequently, the circuit in FIG. 2 suffers from low gain.

FIG. 2A shows a circuit which is very similar to FIG. 2 and differs only in how the hysteresis in the circuit is achieved. FIG. 2A shows a bias current circuit comprising transistor M18, Q29, and resistor R40. The differential input stage comprises transistors Q0, Q1, Q2, Q3, Q4, and Q5. The output stage comprises M15 and M19. M13, M14, M15, M16, and M51 are current sources for the circuit. The base of Q3 is the inverting input and the base of Q0 is the non-inverting input of the differential stage. Resistors R26, R29, and R36 form a voltage divider to set up the voltage reference for the inverting input and to form the hysteresis circuit.

In operation, the output of the circuit, opoff, switches when the input, drain, rises to the threshold voltage of the circuit. At that point, Q0 and Q1 turn off while transistors Q3 and Q2 turn on. With Q3 on, M36 and M19 are turned on thereby activating the hysteresis circuit and pulling the output to a low voltage, respectively. The hysteresis circuit is activated by transistor M36 effectively shorting resistor R30 which effectively changes the voltage reference on the inverting input. The problem with this circuit is that current is always flowing in through the voltage divider network. Additionally the resistor R36 reference voltage tends to vary.

SUMMARY OF THE INVENTION

Therefore, it is an object of the invention to provide a comparator which has high gain.

It is further an object of this invention to provide a comparator which does not require a large resistor and, therefore, does not require a large area for the resistor on an integrated circuit.

These and other objects, advantages, and features will be apparent to those skilled in the art from the following detailed description of the invention, when read in conjunction with the accompanying drawings and appended claims.

In accordance with a broad aspect of the invention a comparator with a built-in offset is disclosed. The disclosed comparator includes a bias current circuit, a differential input stage with the built-in offset, and a hysteresis circuit. The built-in offset is generated by using a resistor in the differential input stage such that the resistor is driven by the bias current as well as the current generated by the hysteresis circuit.

In accordance with another broad aspect of the invention, a reset circuit which uses the comparator with the built-in offset is disclosed. The reset circuit uses a voltage divider circuit to divide the first input voltage. A band-gap voltage reference is used to provide the second input voltage to the comparator. Therefore, the reset circuit generates a reset signal when the divided voltage reaches the value of the band-gap voltage plus the offset.

In accordance with another broad aspect of the invention, a comparator which includes a bias current circuit with a hysteresis circuit is disclosed. The bias current circuit provides a bias voltage to transistors in the differential input stage of the comparator. The bias voltage is used by the

3 transistors to generate bias currents in the differential stage. The hysteresis circuit in the bias current stage changes the bias voltage to at least one of the transistors in the differential input stage which effectively adds hysteresis to the circuit.

BRIEF DESCRIPTION OF THE DRAWING

FIG. 4 is a schematic drawing of voltage divider.

FIG. 5 is a schematic drawing of another embodiment of a comparator with a bias circuit which includes a hysteresis circuit.

DETAILED DESCRIPTION OF THE PREFERRED EMBODIMENT

Figure 1:
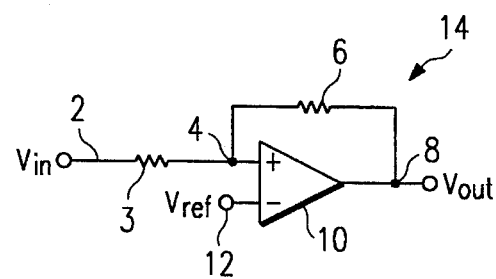
FIG. 1 is a block diagram of a comparator with hysteresis as known in the prior art.
Figure 2:
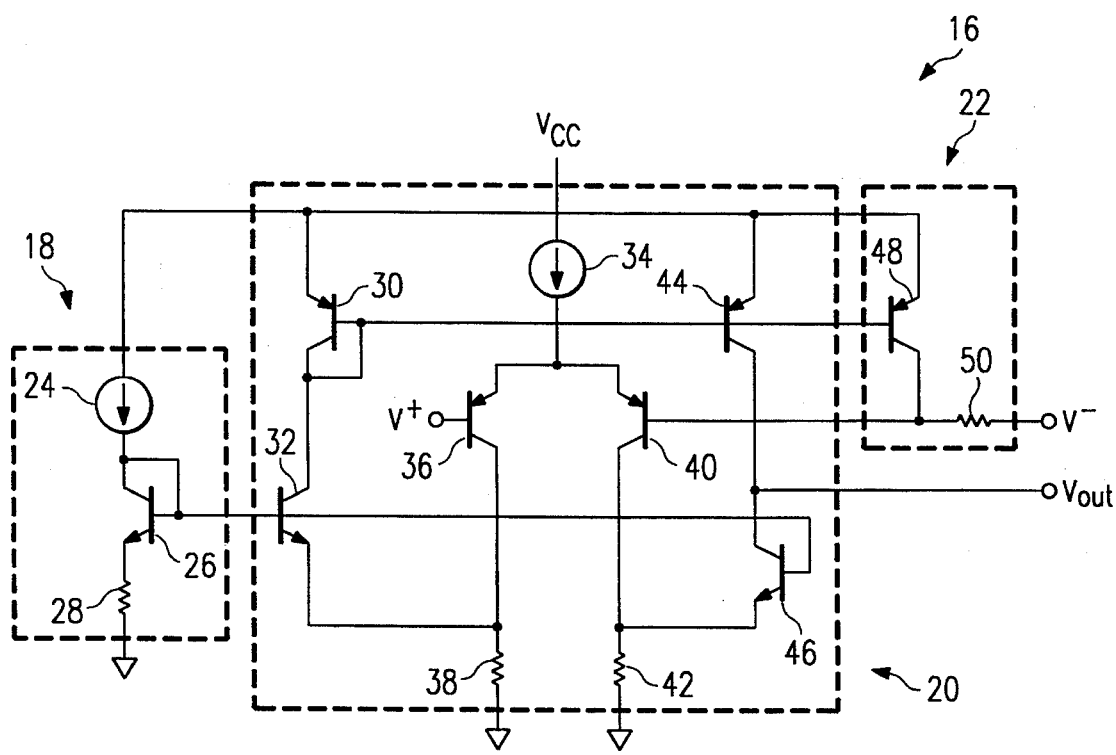
FIG. 2 is a schematic drawing of a comparator with internal hysteresis as known in the prior art.
Figure 2A:
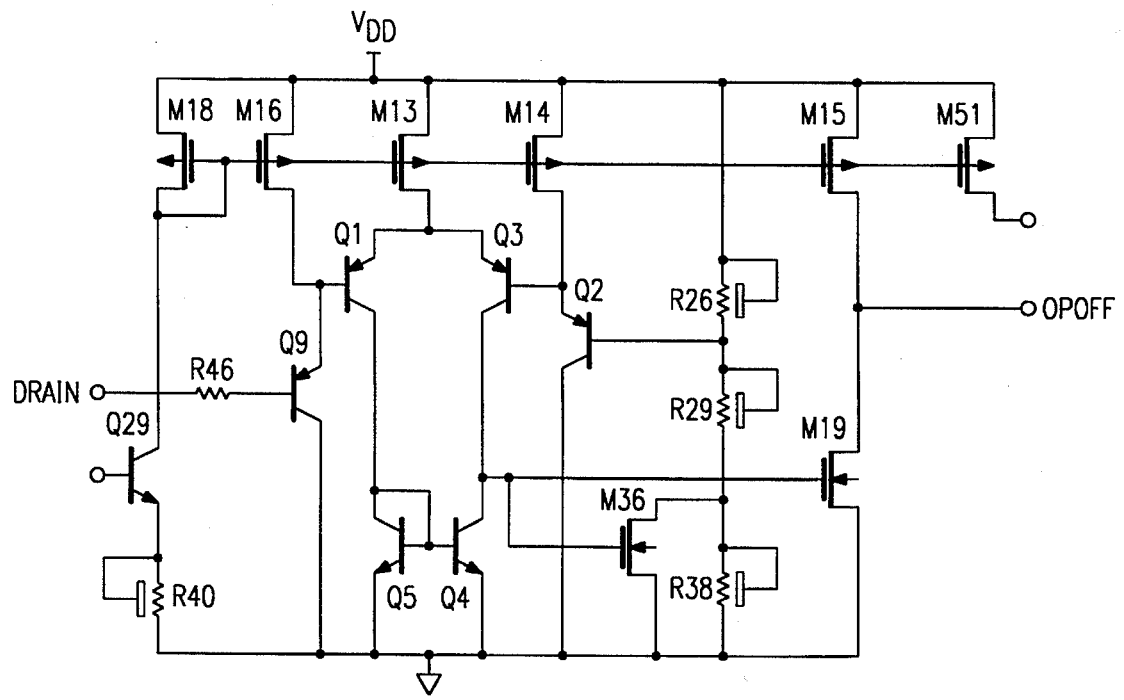
FIG. 2A is a schematic drawing of a second comparator with internal hysteresis as known in the prior art.
Figure 3:
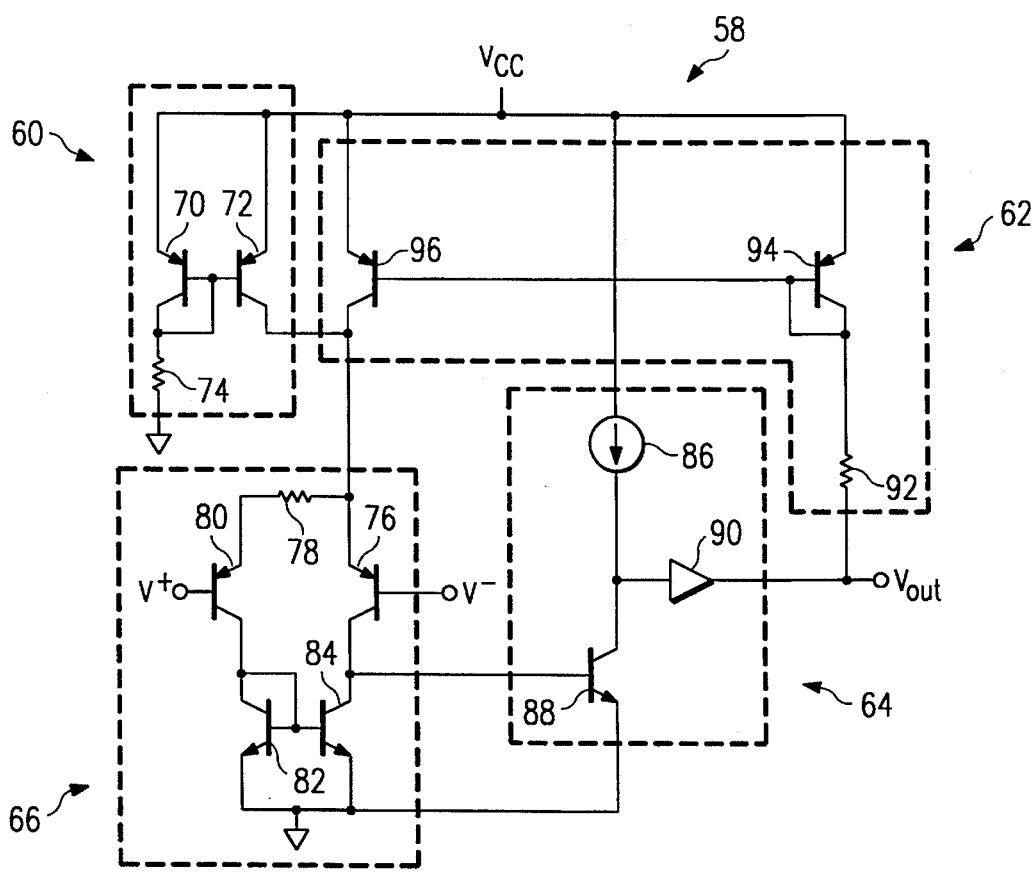
FIG. 3 is schematic drawing of an embodiment of comparator with an internal offset, an embodiment of the invention.

A comparator with a built-in offset constructed according to an embodiment of the invention will be described. Referring now to FIG. 3, comparator 58 with built-in offset is constructed with a bias current circuit 60, a differential input stage which has an offset circuit 66, an output stage 64, and a hysteresis circuit 62. More specifically, the current bias circuit includes a current mirror created by PNP transistor 70 and PNP transistor 72. The emitters of transistors 70 and 72 are connected to Vcc and the base of transistor 70 is connected to its collector, to resistor 74, and to the base of transistor 72. The other end of resistor 74 is connected to a voltage reference, ground. The collector of transistor 72 is the output of the bias current circuit.

The differential input stage 66 is constructed with an emitter of PNP transistor 76 connected to the output of the bias current circuit 60 and to one end of a built-in offset circuit, which is a resistor 78 in this embodiment. The other end of resistor 78 is connected to the emitter of PNP transistor 80. The base of transistor 80 is the non-inverting input V$^+$ of the differential input stage and the base of transistor 76 is the inverting input V$^-$. The collector of transistor 80 is connected to the collector and base of an NPN transistor 82 and the base of a NPN transistor 84. The emitters of transistors 82 and 84 are connected to a voltage reference, ground. The collectors of transistors 76 and 84 are connected together and form the output of the differential input stage 66.

The output stage 64 is constructed by connecting the drain of current source 86 to Vcc. The source of current source 86 is connected to the input of an buffer amplifier 90 and the collector of a NPN transistor 88. The base of transistor 88 is connected to the output of the differential input stage 66. The emitter of transistor 88 is connected to ground. The output of the buffer amplifier 90 is the output of the output stage 64 and the output of comparator 58.

The hysteresis circuit 62 is constructed by connecting one end of a resistor 92 to the output of buffer amplifier 90 and connecting the other end to the collector and base of a PNP transistor 94 and to the base of a PNP transistor 96. The emitters of transistors 94 and 96 are connected to Vcc. The collector of transistor 96 is connected to the collectors of transistors 76 and 72.

In operation, bias circuit 60 provides a bias current for the differential input stage 66 by setting a current controlled by transistor 70 and resistor 74 and mirrored by transistor 72. The bias current is fed into the differential input stage 66. The differential input stage 66 operates by conducting the bias current either through transistor 80 or transistor 76, depending on the voltage on the V$^+$ input relative to the V$^-$ input. If the voltage on the V$^+$ input is sufficiently higher than the voltage on the V$^-$ input, transistor 80, 82, and 84 will be off and transistor 76 will be on driving the output of the differential input stage 66 to a relatively high voltage. Consequently, transistor 88 will be on which will pull the input of buffer amplifier 90 low which causes the output of buffer amplifier 90 to be at a low voltage. Therefore, the output of the comparator 58 is at a relatively low voltage. Conversely, if the voltage on the V$^-$ input is sufficiently higher than the voltage on the V$^+$ input, transistor 76 will be off and transistors 80, 82, and 84 will be on, thus sinking the output of the differential input stage 66 to a relatively low voltage. Consequently, transistor 88 will be off which will allow current source 86 to drive the input of buffer amplifier 90 to a relatively high voltage. Therefore, the output of buffer amplifier 90 and comparator 58 is at a relatively high voltage.

When the output voltage is low, transistor 94 is forward biased through resistor 92. The current in transistor 94 is mirrored through transistor 96 which feeds current though the differential input stage 66. Consequently, the extra current adds hysteresis to the offset voltage.

The offset voltage created by resistor 78 can be described by the following equation:

$V_{off} = \frac{1}{2} * (I_{72} + I_{96}) * R_{78}$ where $V_{off}$ = the offset voltage $I_{72}$ = the current through transistor 72

$I_{96}$ = the current through transistor 96 generated by the hysteresis circuit 62

$R_{78}$ = the resistance of resistor $R_{78}$

The above equations shows that the $V_{off}$ voltage depends on the current through the hysteresis circuit. Therefore, the $V_{off}$ depends on whether the hysteresis circuit has been turned on. In this embodiment, $I_{72}$ is designed to be 100 microamps, I96 is designed to be 22 microamps, and $R_{78}$ is 3.4 Kohms. Using these values, it has been observed that this embodiment has high gain and does not require a high resistance resistor such as in the prior art.

Because of the inventions high gain and relatively small resistance resistor, the circuit can be easily configured as a reset circuit by adding a voltage divider circuit across the V$^+$ input and by connecting the V$^+$ input to a reference voltage, such as a band-gap reference voltage. FIG. 4 shows a simple voltage divider circuit 100 constructed by connecting two resistors, 102 and 104 in series. A divided voltage results from the voltage divider circuit and is proportional to the ratio of the resistances of the two resistors, as is known in the art. When the voltage divider 100 is connected to the V+ input and a band-gap voltage reference is connected to the V− input of comparator 58 of FIG. 3, a reset circuit is constructed which takes advantage of the inventions high gain and small resistor.

In an embodiment of the reset configuration, the band-gap voltage can be approximately 1.27 volts and the divided voltage can be approximately 0.25 of the Vcc voltage. Further, $I_{72}$ can be set at 100 microamps and $I_{96}$ can be set at 22 microamps. With these parameters, the trip points can be calculated as $V_{trip1}=0.25[V_{BG}-\frac{1}{2}(I_{72}+I_{96})R_{78}]=0.25[1.27-0.5(100*10^{-6}+22*10^{-6})3.4\ k]=$ $V_{trip2}=0.25[V_{BG}-\frac{1}{2}(I_{72})R_{78}]=0.25[1.27-0.5(100*10^{-6})3.4\ k]=$ Using these parameters, the output of the reset circuit is very stable because of the high gain and the large hysteresis of the circuit which is advantageous over a reset circuit constructed with a prior art comparator.

Referring now to FIG. 5, another embodiment of a comparator 108, with hysteresis, will now be described. Comparator 108 includes a bias circuit 110, a differential input stage 112, and an output stage 114. The bias circuit 110 includes resistor 116, n-channel MOSFET transistors 118, 120 and 130. The differential input stage includes PNP transistors 122 and 130, NPN transistors 124 and 132, resistor 126, and n-channel MOSFET transistors 128 and 134. The output stage 114 includes p-channel MOSFET transistors 136, 140, 144, and 148, and n-channel transistors 138, 142, 146, and 150.

More specifically, bias circuit 110 is constructed by connecting a first end of resistor 116 to a voltage source, Vcc. The second end of resistor 116 is connected to the drain and gate of transistor 118, to the drain of transistor 120, to the gate of transistor 134, and the gate of transistor 138. The source of transistor 118 is connected to a voltage reference, ground. The source of transistor 120 is connected to the gate of transistor 128 and the drain of transistor 130. The gate of transistor 120 is connected to the drains of transistors 140 and 142 and the to gates of transistors 144 and 146. The gate of transistor 130 is connected to the drains of transistors 144 and 146 and to the gates of transistors 148 and 150. The source of transistor 130 is connected to ground.

The differential input stage 112 is constructed by connecting the base of transistor 130 to the base and collector of transistor 122 and to the collector of transistor 124. The emitters of transistors 122 and 130 are connected to Vcc. The base of transistor 124 is the $V^+$ (non-inverting) input for the differential input stage. The emitter of transistor 124 is connected to a first end of resistor 126 and the drain of transistor 128. The source of transistor 128 is connected to ground. The collector of transistor 130 is connected to the gate of transistor 136 and to the collector of transistor 132. The base of transistor 132 is the $V^-$ (inverting) input for the differential input stage 112. The emitter of transistor 132 is connected to the second end of resistor 126 and to the drain of transistor 134. The source of transistor 134 is connected to ground.

The output stage 114 of comparator 108 is constructed by connecting the sources of transistors 136, 140, 144, and 148 to Vcc. The sources of transistors 138, 142, 146, 150 are connected to ground. The drains of transistors 136 and 138 are connected to the gates of transistors 140 and 142, which form a first inverter 141. The drains of transistors 140 and 142 are connected to the gates of transistors 144 and 146, which form the second inverter 142. The drains of transistors 144 and 146 are connected to the gates of transistors 148 and 150, which form the third inverter 143. The drains of transistors 148 and 150 form the output of the third inverter as well as the output of the output stage 114 and the output of comparator 108. The first inverter 141, the second inverter 143, and the third inverter 145 invert the voltage on the gates of transistors 140 and 142. The inverters buffer the output of the differential input stage and provide the control signals for the gates of transistors 120 and 130.

In operation, if the input voltage on the $V^+$ input is lower than the input voltage on the $V^-$ input, then transistor 132 will be forward biased (turned on) and transistor 124 will be reversed bias (turned off). Consequently, transistors 122 and 130 are turned off which allows transistor 132 to turn on transistor 136. Since transistor 138 is current limited by the bias voltage from the bias circuit 110, the current provided by transistor 136 drives the input of the first inverter 141 to a high voltage. Consequently, the output of the first inverter 141 is low, the output of the second inverter 143 is high, and the output of the third inverter 145 (and thus the output of the comparator) is low. Transistor 120 will be turned off since its gate is connected to the output of the first inverter 141. At the same time, transistor 130 will be turned on since its gate is connected to the output of the second inverter 143. Therefore, the hysteresis circuit formed by transistors 120 and 130 effectively turn transistor 128 off which forces any current flowing through transistor 124 to flow through resistor 126 and transistor 134.

Conversely, if the input voltage on the $V^+$ input is higher than the input voltage on the $V^-$ input, then transistor 132 will be reverse biased (turned off) and transistor 124 will be forward biased (turned on). Thus, transistors 122 and 130 are turned on which charge the gate of transistor 136 turning it off. Since transistor 138 is always conducting current, the charge on the input of inverter 141 driven to a low voltage. Consequently, the output of the first inverter 141 is high, the output of the second inverter 143 is low, and the output of the third inverter 145 (and thus the comparator) is high.

The bias circuit 110 provides bias voltages to the gates of transistors 128, 134, and 138. Transistors 128 and 134 use the bias voltage to provide bias currents for the differential input stage 112. Transistor 128 provides the bias current for the $V^+$ input side of the differential input stage and transistor 134 provides the bias current for the $V^-$ input side of the differential input stage.

In the bias circuit 110, transistors 120 and 130 form a hysteresis circuit. The hysteresis circuit operates by changing the bias voltage on the gate of transistor 128 from the bias voltage on the gate of transistor 118 to ground when the output Vout of the output stage 114, is at a low voltage. In that state, the gate of transistor 130 is at a high voltage which turns transistor 130 on. Thus, the voltage on transistor 120 is at a low voltage which turns transistor 120 off. Consequently, the gate of transistor 128 is pulled to a low voltage level which reduces the bias current through transistor 128 to around zero microamps. The hysteresis voltage is achieved by requiring the current in transistor 124 to go through resistor 126 at the balance point of the differential input stage 112. Therefore, the hysteresis in the circuit is defined by the following equation:

$V^{hys}=I_{134}R_{126}$ where;

$I_{134}$=the bias current created through transistor 134,
$R_{126}$=the resistance of resistor 126.

With transistor 128 off, the balance point of the differential input stage 112 changes such that the $V^+$ input must overcome the $V^{hys}$ before the comparator will change states from the low to high direction. With $R_{126}=1$ Kohm and a $I_{134}=100$ microamps, a typical hysteresis of 100 millivolts can be achieved with while maintaining a gain greater than 60 db. Therefore, this embodiment is advantageous over the prior art since relatively small resistance values of resistor 126 create large hysteresis values while maintaining a high gain. Additionally, it has been observed that the comparator with hysteresis in the bias current circuit is more constant over temperatures and processes.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A comparator circuit comprising:

a differential input stage having a $V^+$ input for receiving a first voltage, a $V^-$ input for receiving a second voltage, having a first bias voltage input, having a second bias voltage input, and having an output;

an output stage having an input for receiving the output of the differential input stage and having an output, the output stage comprising at least one inverter; and a bias circuit having a bias voltage connected to the first bias voltage input of the differential input stage and having a hysteresis circuit wherein the hysteresis circuit comprises:

a means for selectively applying the bias voltage to the second bias voltage input of the differential amplifier, wherein the means for selectively applying the bias voltage comprises:

a first transistor having a current path between the bias voltage and the second bias voltage input of the differential input stage and having a control element connected to the input of the at least one inverter of the output stage, and a second transistor having a current path connected between the second bias voltage input and ground, and having a control element connected to the output of the at least one inverter of the output stage.

2. The comparator circuit of claim 1 wherein the first and second transistors are MOSFET transistors.

3. The comparator circuit of claim 2 wherein the first and second transistors are n-channel MOSFET transistors.

4. A comparator comprising:

a differential input stage comprising:

a current mirror having a primary current path and having a mirrored current path;

a first input transistor having a control element for receiving a first input voltage, and having a first current path with a first end connected to the primary current path of the current mirror, and having a second end;

a second input transistor having a control element for receiving a second input voltage, and having a second current path with a first end connected to the mirrored current path of the current mirror, and having a second end;

a resistor connected across the second ends of the current paths of the first and second input transistor;

a first current bias transistor having a current path with a first end connected to the second end of the current path of the first input transistor, having a second end connected to ground, and having a control element;

a second current bias transistor having a current path with a first end connected to the second end of the current path of the second input transistor, having a second end connected to ground, and having a control element;

an output stage having an input connected to the first end of the current path of the second input transistor, and having an output, wherein said output stage comprises at least one inverter; and a bias circuit having a bias voltage output which is connected to the control element of the second current bias transistor, the bias current circuit further comprising a hysteresis circuit, for selectively connecting the bias voltage output to the control element of the first current bias transistor.

5. The comparator of claim 4 wherein the hysteresis circuit of the bias circuit further comprises a transistor with a current path connected between the bias voltage output and the control element of the first current bias transistor, and has a control element connected the output stage.

6. The comparator of claim 5 wherein the hysteresis circuit further comprises a second transistor having a current path between the control element of the first current bias transistor and ground, and has a control element connected to the output stage.

* * * * *

UNITED STATES PATENT AND TRADEMARK OFFICE
CERTIFICATE OF CORRECTION

PATENT NO.    :   5,587,674

DATED         :   12/24/96

INVENTOR(S)   :   Danstrom

It is certified that error appears in the above-identified patent and that said Letters Patent is hereby corrected as shown below:

In Item [56] References Cited on the front cover of the patent, the following reference should be added under U.S. PATENT DOCUMENTS:

5,039,888  8/1991  Bell et al.    327/73

In Item [56] References Cited on the front cover of the patent, the following reference should be added under FOREIGN PATENT DOCUMENTS:

DE 3045366 A1  6/1982  Germany

Signed and Sealed this

Twenty-sixth Day of May, 1998

Attest:

BRUCE LEHMAN

Attesting Officer

Commissioner of Patents and Trademarks